United States Patent
Setlur et al.

(10) Patent No.: US 7,857,994 B2
(45) Date of Patent: *Dec. 28, 2010

(54) GREEN EMITTING PHOSPHORS AND BLENDS THEREOF

(75) Inventors: Anant Achyut Setlur, Niskayuna, NY (US); Oltea Puica Siclovan, Rexford, NY (US); Prasanth Kumar Nammalwar, Bangalore (IN); Ramesh Rao Sathyanarayan, Bangalore (IN); Digamber G. Porob, Goa (IN); Ramachandran Gopi Chandran, Bangalore (IN); William Jordan Heward, Saratoga Springs, NY (US); Emil Vergilov Radkov, Euclid, OH (US); Linda Jane Valyou Briel, Niskayuna, NY (US)

(73) Assignee: GE Lighting Solutions, LLC, Cleveland, OH (US)

( * ) Notice: Subject to any disclaimer, the term of this patent is extended or adjusted under 35 U.S.C. 154(b) by 370 days.

This patent is subject to a terminal disclaimer.

(21) Appl. No.: 11/755,495

(22) Filed: May 30, 2007

(65) Prior Publication Data
US 2008/0296596 A1    Dec. 4, 2008

(51) Int. Cl.
*C09K 11/59* (2006.01)
*C09K 11/55* (2006.01)
(52) U.S. Cl. .................. 252/301.4 F; 252/301.6 F; 252/301.4 R; 252/301.4 H; 252/301.4 P; 257/98; 313/503
(58) Field of Classification Search ........ 252/301.4 R–301.6 F; 257/98; 313/503
See application file for complete search history.

(56) References Cited

U.S. PATENT DOCUMENTS

| 4,590,405 | A | 5/1986 | Hoeks et al. |
| 6,657,379 | B2 | 12/2003 | Ellens et al. |
| 6,670,748 | B2 * | 12/2003 | Ellens et al. ............. 313/503 |
| 6,717,353 | B1 | 4/2004 | Mueller et al. |
| 6,809,781 | B2 * | 10/2004 | Setlur et al. ............. 349/70 |
| 7,229,573 | B2 * | 6/2007 | Setlur et al. ........ 252/301.4 R |
| 7,321,191 | B2 * | 1/2008 | Setlur et al. ............. 313/487 |

(Continued)

FOREIGN PATENT DOCUMENTS

JP    2007-223864    *    9/2007

(Continued)

OTHER PUBLICATIONS

Y.Q. Li, C.A. Delsing, G. de With, H.T. Hintzen, "Luminescence Properties of $Eu^{2+}$-Activated Alkaline-Earth Silicon-Oxynitride $MSI_2O_{2-\delta}N_{2+2/3\delta}$ (M = Ca, Sr, Ba): A Promising Class of Novel LED Conversion Phosphors", *Chem. Mater.*, vol. 17, No. 12, pp. 3242-3248, (2005).

(Continued)

*Primary Examiner*—C. Melissa Koslow
(74) *Attorney, Agent, or Firm*—Fay Sharpe LLP

(57) ABSTRACT

Phosphor compositions, blends thereof and light emitting devices including white light emitting LED based devices, and backlights, based on such phosphor compositions. The devices include a light source and a phosphor material as described. Also disclosed are phosphor blends including such a phosphor and devices made therefrom.

37 Claims, 11 Drawing Sheets

U.S. PATENT DOCUMENTS

2005/0230689 A1* 10/2005 Setlur et al. .................. 257/79
2006/0091778 A1* 5/2006 Setlur et al. ................. 313/486
2007/0205712 A1 9/2007 Radkov et al.
2008/0296596 A1 12/2008 Setlur et al.

FOREIGN PATENT DOCUMENTS

| WO | WO 2004/030109 A1 | 4/2004 |
|---|---|---|
| WO | WO 2004/036962 A1 | 4/2004 |
| WO | WO 2005/030903 A1 | 4/2005 |
| WO | WO 2005/030904 A1 | 4/2005 |
| WO | WO 2007/088966 A1 | 8/2007 |
| WO | WO 2007/100824 A2 | 9/2007 |

OTHER PUBLICATIONS

Volker Bachmann, et al., "Luminescence properties of $SrSi_2O_2N_2$ doped with divalent rare earth ions", *Journal of Luminescence*, vol. 121, pp. 441-449, (2006).

Henning A. Hoppe, Florian Stadler, Oliver Oeckler and Wolfgang Schnick, "$Ca[Si_1O_2N_2]$—A Novel Layer Silicate", *Angew. Chem Int. Ed.*, vol. 43, pp. 5540-5542 (2004).

\* cited by examiner

GREEN EMITTING PHOSPHORS AND BLENDS THEREOF

STATEMENT OF GOVERNMENT INTEREST

This invention was made with Government support under Contract Number DE-FC26-06NT42934, awarded by the Department of Energy, which has certain rights to this invention as provided for in the terms of that contract.

BACKGROUND OF THE INVENTION

The present exemplary embodiments relate to phosphor compositions, particularly phosphors for use in lighting and other applications. More particularly, the present embodiments relate to novel green emitting phosphors, blends incorporating such phosphors and a lighting apparatus employing these phosphors.

Light emitting diodes (LEDs) are semiconductor light emitters often used as a replacement for other light sources, such as incandescent lamps. They are particularly useful as display lights, warning lights and indicator lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). With reference to the GaN-based LEDs, light is generally emitted in the UV to green range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Continuous performance improvements have enabled new applications for LEDs of saturated colors in traffic lights, exit signs, store signs, and the like.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complementary color, e.g. a yellowish emission. Together, the blue and yellowish radiation produces a white light. There are also white LEDs that utilize a near UV emitting chip and a phosphor blend including red, green and blue-emitting phosphors designed to convert the UV radiation to visible light.

Known white light emitting devices comprise a blue light-emitting LED having a peak emission wavelength in the near blue range (from about 440 nm to about 480 nm) combined with a yellow light-emitting phosphor, such as cerium(III) doped yttrium aluminum garnet ("YAG:Ce"), a cerium(III) doped terbium aluminum garnet ("TAG:Ce"), or a europium (II) doped barium orthosilicate ("BOS"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light as a white light. The total of the light from the phosphor material and the LED chip provides a color point with corresponding color coordinates (x and y) and correlated color temperature (CCT), and its spectral distribution provides a color rendering capability, measured by the color rendering index (CRI).

Such systems can be used to make white light sources having CCTs of >4500 K and CRIs ranging from about 70-82, with luminous efficacy of radiation ("LER", also referred to as luminosity) of about 330 lm/$W_{opt}$. While this range is suitable for many applications, general illumination sources usually require lower CCTs and higher CRIs, preferably with similar or better LER. As the CCT is lowered and/or the CRI is increased, the LER value generally decreases, leading to values for "warm white" LEDs (of CCT<4500K) significantly lower than those for "cool white" LEDs (of CCT>4500K).

One particularly preferred application of white LED devices made from blue emitting chips and yellow emitting phosphors is for backlights, e.g. in cellular phones, personal digital assistants, and the like. These applications require high CCT values (greater than 5000K), which are readily provided by the aforementioned LEDs, with LER values of 280 lm/$W_{opt}$ or greater.

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value.

Other white light LED lighting systems use a UV or visible light LED chip along with a blend of red, green, and/or blue phosphors that can be efficiently excited by near-UV radiation to make white light.

Current green phosphors that can be excited by ultraviolet/blue LEDs, such as $SrAl_2O_4:Eu^{2+}$ or $(Ba,Sr)_2SiO_4:Eu^{2+}$ have issues with strong luminescence quenching at high temperatures (T>100 C) or hydrolytic instability. This can limit their use in a variety of applications such as general illumination lighting as well as display backlighting.

LED chips emitting in the green region of the spectrum (e.g. with a peak wavelength from about 500 to 565 nm) are known in the art. However, LED quantum efficiency is adversely impacted in this wavelength interval, for any known chip chemistry. This is also referred to as "the green abyss" and has resulted in pursuing green phosphor converted LEDs, e.g. made with highly efficient near UV chip and highly efficient green phosphor.

Thus, a continuing need exists for new green emitting phosphors and blends incorporating the same for use in conjunction with UV and visible LED chips that are stable in water and in high humidity conditions, and have virtually no thermal quenching at T>100 C.

BRIEF SUMMARY

In a first aspect, there is provided a luminescent material activated by at least one of $Eu^{2+}$ and $Ce^{3+}$, having the following composition:

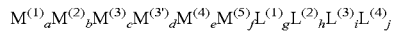
$$M^{(1)}_a M^{(2)}_b M^{(3)}_c M^{(3)'}_d M^{(4)}_e M^{(5)}_f L^{(1)}_g L^{(2)}_h L^{(3)}_i L^{(4)}_j$$

where $M^{(1)}$ comprises one or more monovalent cations, $M^{(2)}$ comprises one or more divalent cations, $M^{(3)}$ comprises one or more trivalent elemental cations selected from the group consisting of trivalent lanthanides, $Y^{3+}$, $Sc^{3+}$, $In^{3+}$, and $Ce^{3+}$, $M^{(3)'}$ comprises one or more trivalent elemental cations selected from the group consisting of $Al^{3+}$, $Ga^{3+}$, and $In^{3+}$, $M^{(4)}$ comprises one or more tetravalent elemental cations, $M^{(5)}$ comprises one or more pentavalent elemental cations, $L^{(1)}$ comprises one or more monovalent elemental anions, $L^{(2)}$ comprises one or more divalent elemental anions, $L^{(3)}$ comprises one or more trivalent elemental anions, and $L^{(4)}$ comprises one or more tetravalent anions, wherein $a+b+c=1$, $2.5<(d+e+f)/(a+b+c)\leq 4.5$, $3\leq h\leq 5$, $1.25\leq i\leq 2.75$, $0\leq j\leq 1$ and $a+2b+3c+3d+4e+5f=g+2h+3i+4j$.

In a second aspect, there is provided a luminescent material activated by at least one of $Eu^{2+}$ and $Ce^{3+}$, the material having an x-ray diffraction pattern exhibiting peaks having a d-spacing substantially matching a predetermined list.

In a third aspect, there are provided blends of the above luminescent materials with other luminescent materials.

In a fourth aspect, there is provided a lighting device comprising the luminescent material.

DETAILED DESCRIPTION OF THE EXEMPLARY EMBODIMENTS

Phosphors convert radiation (energy) to visible light. Different combinations of phosphors provide different colored light emissions. Novel phosphor compositions and blends are presented herein as well as their use in LED and other light sources.

The color of the generated visible light is dependent on the particular components of the phosphor material. The phosphor material may include only a single phosphor composition or two or more phosphors of basic color, for example a particular mix with one or more of a green, blue and red phosphor to emit a desired color (tint) of light. As used herein, the terms "phosphor", "phosphor material" and "luminescent material" are used interchangeably and may be used to denote both a single composition as well as a blend of two or more compositions.

It was determined that an LED lamp that produces a white light would be useful to impart desirable qualities to LEDs as light sources. Therefore, in one embodiment, a luminescent material phosphor conversion material blend (phosphor blend) is disclosed for providing white light, especially when used in LEDs. The phosphor blends presented in this embodiment enable white light with an optimal combination of CRI and LER at any CCT of interest, when excited by radiation from about 250 to 500 nm as emitted by a near UV to blue-green LED.

Figure 1:
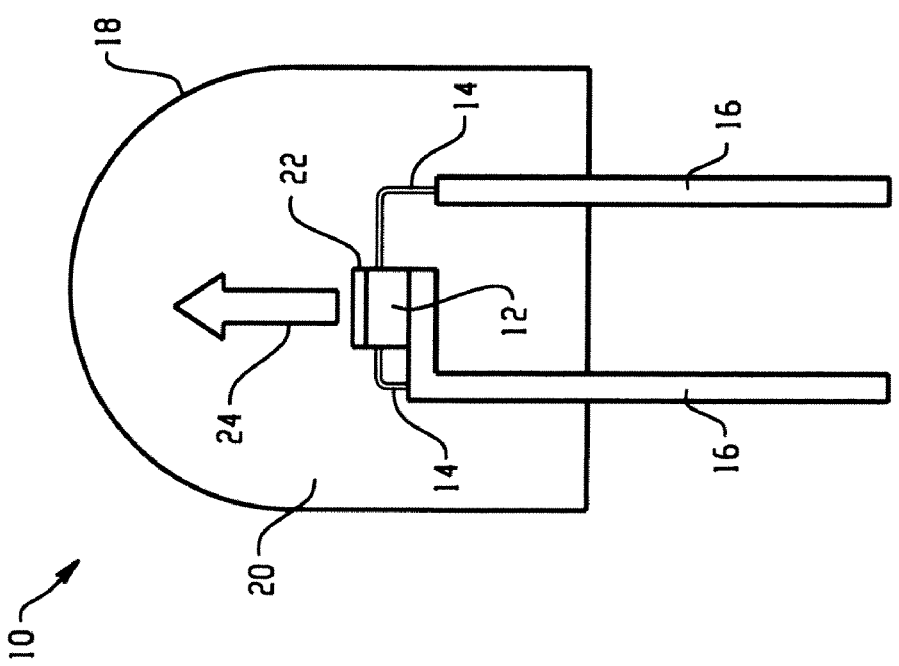
FIG. 1 is a schematic cross-sectional view of an illumination system in accordance with one embodiment of the present invention.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

In one embodiment, a light emitting device is provided which may include any visible or UV source that is capable of producing light when its emitted radiation is coupled to the luminescent materials provided in the general embodiments of the present invention. Preferably, a semiconductor light source such as an LED chip is used, with a peak emission that will depend on the identity of the phosphors in the disclosed embodiments and may range from, e.g., 200-500 nm. In one preferred embodiment, however, the emission of the LED will be in the near UV to blue-green region and have a peak wavelength in the range from about 300 to about 500 nm, more preferably from about 300 to about 480 nm, and even more preferably 370 to 460 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 200 to 500 nm.

Preferably, the LED may contain at least one semiconductor layer comprising GaN, AlN or SiC. For example, the LED may comprise a nitride compound semiconductor represented by the formula $In_iGa_jAl_kN$ (where $0\leq i$; $0\leq j$; $0\leq k$ and $i+j+k=1$) having a peak emission wavelength greater than about 200 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other material having a high index of refraction. In one embodiment, the encapsulant material 20 is a polymer material, such as epoxy, silicone, or silicone epoxy, although other organic or inorganic encapsulants may be used. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so that at least part of the radiation emitted from one is transmitted to the other.

This phosphor material 22 is deposited on the LED 12 by any appropriate method. For example, a suspension of the phosphor(s) can be formed, and applied as a phosphor layer to the LED surface. In one such method, a silicone, epoxy or other matrix material is used (either directly or diluted with an organic solvent, e.g. acetone, MIBK or butyl acetate) to create a slurry in which the phosphor particles are randomly suspended and placed around the LED. This method is merely exemplary of possible positions of the phosphor material 22 and LED 12. Thus, the phosphor material 22 may be coated over or directly on the light emitting surface of the LED chip 12 by coating and drying or curing the phosphor suspension over the LED chip 12. Both the shell 18 and the encapsulant 20 should be transparent to allow light 24 to be transmitted through those elements. Although not intended to be limiting, the median particle size of the phosphor material as measured using light scattering methods or via microscope (electron or optical) measurements may be from about 0.5 to about 20 microns.

Figure 2:
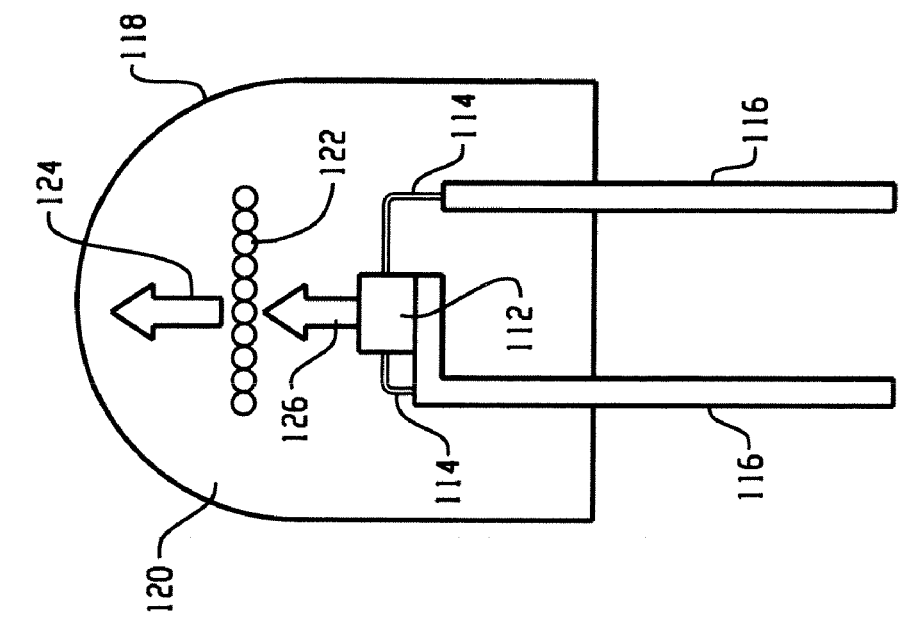
FIG. 2 is a schematic cross-sectional view of an illumination system in accordance with a second embodiment of the present invention.

FIG. 2 illustrates a second preferred structure of the system according to the preferred aspect of the present invention. Corresponding numbers from FIGS. 1-4 (e.g. 12 in FIG. 1 and 112 in FIG. 2) relate to corresponding structures in each of the figures unless otherwise stated. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer molding.

Figure 3:
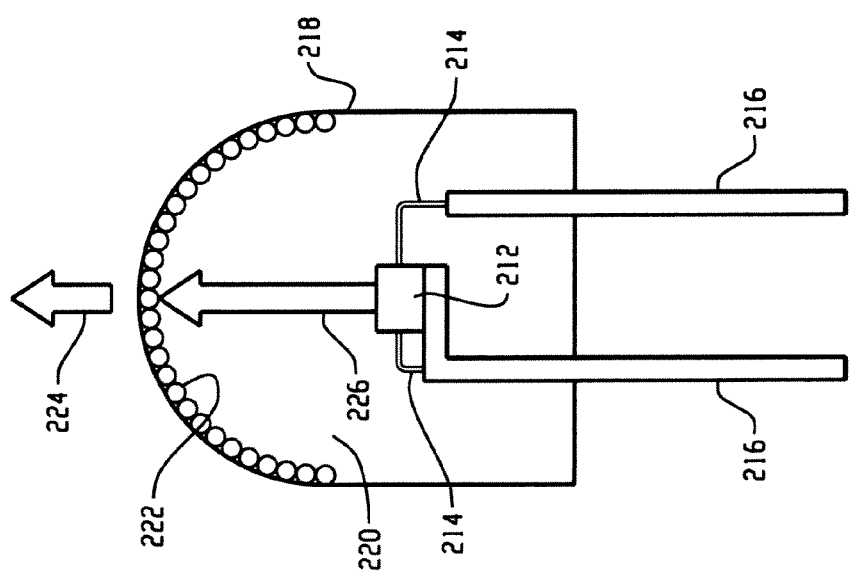
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the coherent light emitted from the LED chip, preferably with a negligible amount of absorption.

Figure 4:
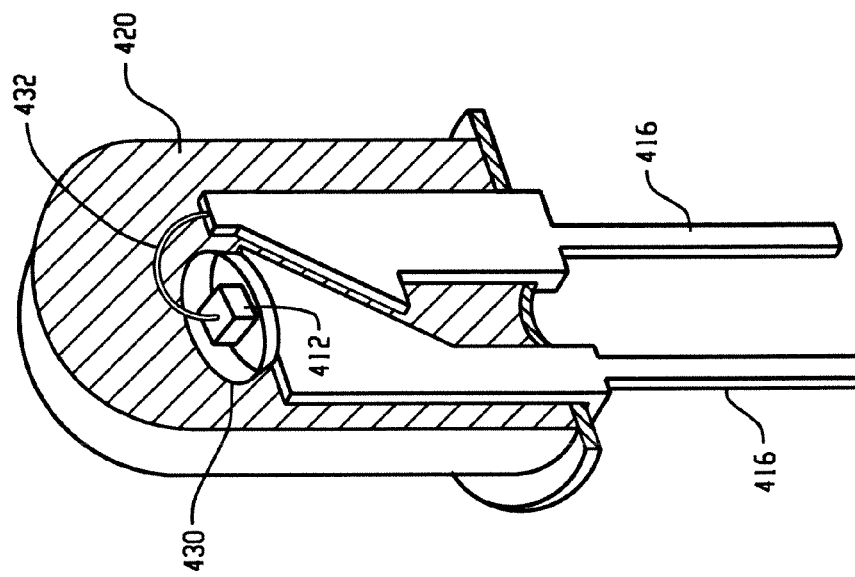
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

Figure 8:
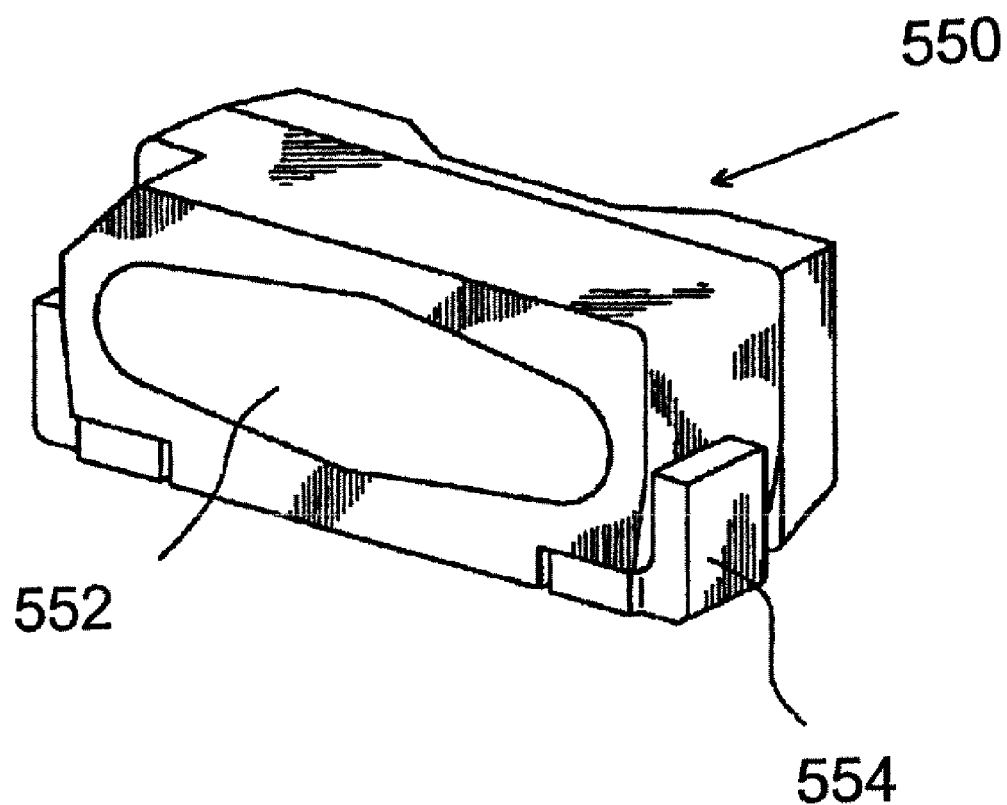
FIG. 8 is a schematic perspective view of a surface mounted device (SMD) backlight LED.

Another preferred structure (particularly for backlight applications) is a surface mounted device ("SMD") type light emitting diode 550, e.g. as shown in FIG. 8. This SMD is of a "side-emitting type" and has a light emitting window 552 on a protruding portion of a light guiding member 554. The SMD type light emitting diodes 550 can be made by disposing LEDs that have been formed beforehand by flow soldering or the like on a glass epoxy substrate, whereon an electrically conductive pattern has been formed and covering said LED with the window 552. There are also "top-emitting" SMD packages known in the art that are also suitable for use in the present embodiments, e.g. those produced by Nichia Corporation. An SMD package may comprise an LED chip as defined above, and a phosphor material as discussed below that is excited by the light emitted from the LED chip.

In a general embodiment, there is provided a phosphor that is believed to have a novel crystal structure as determined by x-ray diffraction. Experiments that have led to the invention described here have shown that a phase hitherto unknown is present. X-ray diffraction analyses carried out on this novel powder within the $BaO$—$SiO_2$—$Si_3N_4$ system yield a characteristic X-ray powder diagram which is shown in table 1. This table gives for a number of reflections the d values for lattice spacings (in Angstroms) and the intensity (normalized to the maximum intensity which is set at 100). An X-ray powder diagram, as is known, characteristic of and reproducible for the crystalline phase of the substance concerned.

TABLE 1

| d (Angstroms) | Intensity |
|---|---|
| 6.46 | 14 |
| 4.58 | 12 |
| 3.75 | 48 |
| 3.24 | 100 |
| 2.89 | 63 |
| 2.45 | 19 |
| 2.29 | 14 |
| 2.16 | 22 |
| 2.05 | 16 |
| 1.95 | 14 |
| 1.87 | 9 |
| 1.80 | 16 |
| 1.73 | 3 |
| 1.62 | 11 |
| 1.57 | 7 |
| 1.45 | 5 |
| 1.41 | 6 |
| 1.38 | 8 |
| 1.35 | 7 |
| 1.30 | 4 |
| 1.25 | 3 |
| 1.23 | 3 |
| 1.20 | 4 |

There is an understanding that due to differences in the treatment of specific samples, small variations can occur, in particular for the intensity ratios. In addition, there can be shifts in the d values within this type of material due to the presence of additional ions and/or changes in the stoichiometry which modify the crystal lattice parameters. It is possible to substitute other cations or anions and/or alter the stoichiometry in this material while retaining the same crystal structure. The X-ray powder diagram will be substantially the same as the materials within the BaO—SiO$_2$—Si$_3$N$_4$ system with shifts in the d values (e.g. to within +/−5%) depending upon the size of the cations/anions and the extent of substitution and/or non-stoichiometry. There may also be changes in the intensity ratios which can also be dependent upon the exact treatment of specific samples, as is known. One such example is the texturing of powder samples, known in the prior art, that can enhance specific diffraction peaks relative to others.

The structure solution from powder X-ray data was done by the direct space approach using the FOX program, http://objcryst.sourceforge.net/Fox/ (using the lowest symmetry, with space group P1). The positional parameters of the heavy atom, Ba, obtained from this attempt clearly indicated $\bar{3}$m Laue symmetry. Space group P $\bar{3}$m1 (#164) was selected based on this analysis for further completion and the structure was refined of structure using the GSAS program [A. C. Larson and R. B. Von Dreele, "General Structure Analysis System (GSAS)", Los Alamos National Laboratory Report LAUR 86-748 (2000).]. The Si atom position located using a difference Fourier approach is in agreement with this symmetry. The cell parameters for a material with a nominal composition of Ba$_{0.95}$Eu$_{0.05}$Si$_3$N$_2$O$_4$ were refined using this space group with a=7.5312, c=6.4969. However, since the space group is selected based on positional parameters of heavy atoms alone, it is possible that the lighter atoms like oxygen/nitrogen may not follow the same symmetry and the actual space group could be different once the positions of all the atoms in the unit cell are found. However, as known in the art, the X-ray powder diagram diffraction pattern is sufficient for the identification of any given phase, including the one described above.

For all practical purposes, phase identification of the materials described in this application can be achieved by examining an experimental XRD powder pattern against the first 12 peaks in Table 1. It should be remembered that peaks with higher d values correspond to lower angles when the X-ray diffraction pattern is plotted in a "two-theta" format, as customary in the art, and that peak positions in the latter format are a function of the X-ray wavelength, unlike the d values. For example, the first 12 peaks from Table 1 will correspond to the range of from about 10 to about 52 degrees in FIGS. 6, 9, 10 and 11, and would be sufficient to identify the novel phase described herein. Impurity peaks (e.g. from unreacted raw materials) in experimental data sets are marked with asterisks, as also customary in the art. The latter peaks are easily identified e.g. by comparison against the known patterns of the raw materials in the existing XRD databases such as the Powder Diffraction File (PDF) of the International Centre for Diffraction Data (ICDD).

In another general embodiment, there is provided a novel phosphor material, which may be used in the above described devices. The phosphor material is a green emitting Eu$^{2+}$ and/or Ce$^{3+}$ activated phosphor having the following composition:

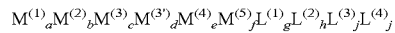

where $M^{(1)}$ comprises one or more monovalent cations, $M^{(2)}$ comprises one or more divalent cations that necessarily includes Eu$^{2+}$, $M^{(3)}$ comprises one or more trivalent elemental cations that can include trivalent lanthanides, Y$^{3+}$, Sc$^{3+}$, In$^{3+}$, and Ce$^{3+}$, $M^{(3')}$ comprises one or more trivalent elemental cations that can include Al$^{3+}$, Ga$^{3+}$, In$^{3+}$, $M^{(4)}$ comprises one or more tetravalent elemental cations, $M^{(5)}$ comprises one or more pentavalent elemental cations, $L^{(1)}$ comprises one or more monovalent elemental anions, $L^{(2)}$ comprises one or more divalent elemental anions, $L^{(3)}$ comprises one or more trivalent elemental anions, and $L^{(4)}$ comprises one or more of tetravalent anions such as C$^{4-}$, wherein a+b+c=1, 2.5<(d+e+f)/(a+b+c)≦4.5, 3≦h≦5, 1.25≦i≦2.75, 0≦j≦1 and a+2b+3c+3d+4e+5f=g+2h+3i+4j.

When used with an LED chip with a peak wavelength emitting at from 200 to 500 nm, more preferably 300 to 500 nm, the use of the above phosphor allows for a green emitting lighting device. In one embodiment, the phosphor will have a emission peak in the range of from about 520 to 530 nm. When used with such a chip and one or more additional phosphors (such as red and blue emitting phosphors), the use of the above phosphor material allows for a white LED. The additional phosphors that can be used with the above described phosphors are described in more detail below.

In another general embodiment, there is provided a novel phosphor material, which may be used in the above described devices. The phosphor material is a green emitting Eu$^{2+}$ and/or Ce$^{3+}$ activated phosphor containing at least Si, N, and O. The material may preferably contain Ba. It may also contain at least one of Cl, F, and S. In one aspect, it may contain at least one of the group consisting of Ba, Sr, Ca, Mg, Zn, and Mn, at least one of the group consisting of Li, Na, K, Rb, and Cs, at least one of the group consisting of a RE (rare earth), Y, and Sc, and at least one of the group consisting of B, Al, P, Si, Ge, and Ga.

In one embodiment, the phosphor or luminescent material has the formula (Ba,Sr,Ca,Mg,Zn,Mn)$_a$Eu$_b$Si$_c$O$_d$N$_e$ where 0.5≦a≦1, 2.5≦c≦3.5, 3≦d≦5, 1.5≦e≦2.5, a+b=1, and 2+4c=2d+3e. In one aspect of this embodiment, the molar ratio of Ba/(Ba+Sr+Ca+Mg+Zn+Eu+Mn)≧0.5. In another aspect of this embodiment, $2.8 \leq c \leq 3.2$; $3.5 \leq d \leq 4.5$; $1.75 \leq e \leq 2.25$. In yet another aspect, $b \leq 0.1$.

In a second embodiment, the phosphor or luminescent material has the formula $(Ba,Sr,Ca,Mg,Zn,Mn)_a Eu_b(Li,Na,K)_c(RE,Y,Sc)_d Si_e O_f N_g$ where $0.5 \leq a \leq 1$, $b>0$, $2.5 \leq e \leq 3.5$, $3 \leq f \leq 5$, $1.5 \leq g \leq 2.5$, a+b+c+d=1, RE is a rare earth, and 2a+2b+c+3d+4e=2f+3g. In one aspect of this embodiment, the molar ratio of Ba/(Ba+Sr+Ca+Mg+Zn+Eu+Mn)≧0.5. In another aspect of this embodiment, $2.8 \leq e \leq 3.2$; $3.5 \leq f \leq 4.5$; $1.75 \leq g \leq 2.25$. In yet another aspect, $b \leq 0.1$. In still another aspect, $c \leq 0.2$.

In another embodiment, the phosphor or luminescent material has the formula $(Ba,Sr,Ca,Mg,Zn,Mn)_a Eu_b Al_c Si_d O_e N_f$ where $0.5 \leq a \leq 1$, $b \geq 0$, $2.5 \leq d \leq 3.5$, $3 \leq e \leq 5$, $1.5 \leq f \leq 2.5$, a+b=1, and 2a+2b+3c+4d=2e+3f. In one aspect of this embodiment, the molar ratio of Ba/(Ba+Sr+Ca+Mg+Zn+Eu+Mn)≧0.6. In yet another aspect, $b \leq 0.1$. In still another aspect, $c \leq 0.9$.

In still another embodiment, the phosphor or luminescent material has the formula $(Ba,Sr,Ca,Mg,Zn,Mn)_a Eu_b(RE,Y,Sc)_c Al_d Si_e O_f N_g$ where $0.5 \leq a<1$, $b>0$, $2.5<d+e \leq 3.5$, $3 \leq f \leq 5$, $1.5 \leq g \leq 2.5$, a+b+c=1, and 2a+2b+3c+3d+4e=2f+3g. In one aspect of this embodiment, the molar ratio of Ba/(Ba+Sr+Ca+Mg+Zn+Eu+Mn)≧0.6. In another aspect, $2.8 \leq d+e \leq 3.2$; $3.5 \leq f \leq 4.5$; $1.75 \leq g \leq 2.25$. In yet another aspect, $b \leq 0.1$. In still another aspect, $c \leq 0.2$.

In yet another embodiment, the phosphor or luminescent material has the formula $(Ba,Sr,Ca,Mg,Zn,Mn)_a Eu_b(Li,Na,K)_c P_d Si_e O_f N_g$ where $0.5 \leq a<1$, $b>0$, $2.5<d+e \leq 3.5$, $3 \leq f \leq 5$, $1.5 \leq g \leq 2.5$, a+b+c=1, and 2a+2b+c+5d+4e=2f+3g. In one aspect of this embodiment, the molar ratio of Ba/(Ba+Sr+Ca+Mg+Zn+Eu+Mn)≧0.6. In another aspect, $2.8 \leq d+e \leq 3.2$; $3.5 \leq f \leq 4.5$; $1.75 \leq g \leq 2.25$. In yet another aspect, $b \leq 0.1$. In still another aspect, $c \leq 0.2$.

The above described phosphor composition can be prepared by taking appropriate raw materials in a ratio sufficient to ensure the desired incorporation level of the activator ion (e.g. between 0.1 and 30 mol. % of the total content, more preferably between 1 and 10 mol %). In an exemplary preparation method, the raw materials are mixed together in an aqueous solution and stirred. The sample is then fired in a reducing atmosphere. The crude phosphor may be then milled (preferably dry-milled) to a desired particle size, washed with an organic solvent (e.g. ethanol or acetone) and dried prior to use.

A variety of other starting materials and procedures may be used to produce the phosphor in this embodiment.

Thus, the above described phosphor compositions may be produced using known solid state reaction processes for the production of phosphors by combining, for example, elemental nitrides, oxides, carbonates and/or hydroxides as starting materials. Alternately, coprecipitates of hydroxides, oxalates, carbonates and the like could be used as the starting materials for the RE elements. Si is typically provided via silicic acid, but other sources such as fumed silica may also be used. In a typical process, the starting materials are combined via a dry or wet blending process and fired in air or under a reducing atmosphere at from, e.g., 1000 to 1600° C.

Additional compounds (i.e. fluxes) may be added to the mixture before or during the step of mixing. Numerous materials are known in the art to improve the quantum efficiency of phosphor materials. Examples of such materials include boron containing compounds (e.g. $Li_2B_4O_7$, $LiBO_2$, Borax, $H_3BO_3$, $B_2O_3$, etc.) and halide containing compounds (e.g. $AlF_3$, $NH_4C_1$, $NH_4Br$, $NH_4F$, $NH_{4I}$, $CaCl_2$, $CaBr_2$, $CaF_2$, $SrCl_2$, $SrBr_2$, $SrF_2$, $BaCl_2$, $BaBr_2$, $BaF_2$, etc.). In addition, it is known that alkali metals such as Na and Li can be used as fluxes as well in the synthesis. This list is meant to be instructive, not exhaustive. Other potential fluxes that have been used to improve phosphor efficiency are discussed in *Inorganic Phosphors: Composition, Preparation, and Optical Properties* by W. M. Yen and M. J. Weber. The fluxes detailed in that book are included herein by reference.

When using these materials as fluxing agents, it is possible that part of the flux constituents become incorporated into the host material. The herein described phosphor formulations are intended to include alterations to the phosphor composition by the incorporation of such fluxing materials, even if not specifically disclosed.

A quantity of a fluxing agent of less than about 20, preferably less than about 5, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a ball mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. The reducing atmosphere typically comprises a reducing gas such as hydrogen, carbon monoxide, ammonia or a combination thereof, optionally diluted with an inert gas, such as nitrogen, argon, etc., or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methylamine, ethylamine, dimethylamine, trimethylamine, or the like may be used in place of ammonium hydroxide.

The precipitate may be filtered, washed with deionized water, and dried. The dried precipitate may then be ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor composition.

The resulting phosphor particles may preferably have median diameters ($d_{50}$) ranging from 0.5-30 µm, as determined by light scattering analysis or microscopy measurements.

While suitable for use alone with a blue or UV LED chip, the above phosphor compositions may be blended with one or more additional phosphors for use in white light sources. Thus, in another embodiment, an LED lighting assembly is provided including a phosphor composition comprising a blend of the above phosphor with one or more additional phosphors.

When used in combination with other phosphor compositions to produce a white light, the relative amounts of each phosphor in the phosphor material can be described in terms of spectral weight. The spectral weight is the relative amount that each phosphor composition contributes to the overall emission spectra of the phosphor blend. The spectral weight amounts of all the individual phosphors should add up to 1. A preferred blend comprises a spectral weight of from 0.01 to 0.80 of the present embodiment phosphor, from 0 to 0.70 of an optional phosphor having a peak emission from about 430 to 500 nm (which may not be needed for excitation with a blue or blue-green LED having a peak emission from about 430 to about 500 nm), and the balance of the blend being a red phosphor, as needed to achieve a targeted color point and CCT value. Any known phosphors suitable for use in near-UV to green LED systems and emitting in the above wavelength ranges may be used.

It should be noted that various phosphors are described herein in which different elements enclosed in parentheses and separated by commas, such as in the case of $(Ba,Sr,Ca)_2SiO_4:Eu^{2+}$. As understood by those skilled in the art, this type of notation means that the phosphor can include any or all of those specified elements in the formulation in any ratio. That is, this type of notation for the above phosphor, for example, has the same meaning as $(Ba_aSr_bCa_{1-a-b})_2SiO_4:Eu^{2+}$, where a and b can vary from 0 to 1, including the values of 0 and 1.

A green emitting phosphor according to the present embodiment may be used to prepare a backlight LED, in conjunction with at least a red emitting phosphor and either a) a blue LED chip (e.g. with a peak emission wavelength between 440 and 470 nm), or b) a blue emitting phosphor (e.g. with a peak emission wavelength between 440 and 470 nm) and a violet to near-UV emitting LED chip (e.g. having a peak emission wavelength from about 370 nm to about 440 nm).

Preferred non-limiting examples of suitable red emitting phosphors include alkaline earth nitridosilicates doped with Eu(II) and/or Ce(III) and complex fluorides or oxyfluorides doped with Mn(IV). Specific particularly preferred compositions are listed further below.

Preferred non-limiting examples of a suitable blue-emitting phosphor include alkaline earth haloapatites doped with Eu(II), e.g. $Sr_5(PO_4)_3Cl:Eu^{2+}$. Other specific compositions are listed further below.

Other preferred blend phosphors include alkaline earth silicates doped with Eu(II), alkaline earth aluminates doped with Eu(II), and garnets doped with Ce(III).

In addition, other phosphors emitting throughout the visible spectrum region, at wavelengths substantially different from those of the phosphors described in the present invention, may be used in the blend to customize the white color of the resulting light and produce sources with improved light quality. While not intended to be limiting, suitable phosphors for use in the blend with the present phosphors include:

$(Ba,Sr,Ca)_5(PO_4)_3(Cl,F,Br,OH):Eu^{2+},Mn^{2+}$ $(Ba,Sr,Ca)BPO_5:Eu^{2+},Mn^{2+}$ $(Sr,Ca)_{10}(PO_4)_6*vB_2O_3:Eu^{2+}$ (wherein $0 \leq v \leq 1$)

$Sr_2Si_3O_8*2SrCl_2:Eu^{2+}$ $(Ca,Sr,Ba)_3MgSi_2O_8:Eu^{2+},Mn^{2+}$ $BaAl_8O_{13}:Eu^{2+}$ $2SrO*0.84P_2O_5*0.16B_2O_3:Eu^{2+}$ $(Ba,Sr,Ca)MgAl_{10}O_{17}:Eu^{2+},Mn^{2+}$ $(Ba,Sr,Ca)_2Si_{1-\xi}O_{4-2\xi}:Eu^{2+}$ (wherein $0 \leq \xi \leq 0.2$)

$(Ba,Sr,Ca)_2(Mg,Zn)Si_2O_7:Eu^{2+}$ $(Y,Gd,Tb,La,Sm,Pr,Lu)_3(Sc,Al,Ga)_5(Sc,Al,Ga)_{5-\alpha}O_{12-3/2\alpha}:Ce^{3+}$ (wherein $0 \leq \alpha \leq 0.5$)

$(Lu,Sc,Y,Tb)_{2-u-v}Ce_vCa_{1+u}Li_wMg_{2-w}P_w(Si,Ge)_{3-w}O_{12-u/2}$ where $-0.5 \leq u \leq 1$; $0 \leq v \leq 0.1$; and $0 \leq w \leq 0.2$ $(Sr,Ca,Ba,Mg,Zn)_2P_2O_7:Eu^{2+},Mn^{2+}$ $(Gd,Y,Lu,La)_2O_3:Eu^{3+},Bi^{3+}$ $(Gd,Y,Lu,La)_2O_2S:Eu^{3+},Bi^{3+}$ $(Gd,Y,Lu,La)VO_4:Eu^{3+},Bi^{3+}$ $(Ca,Sr)S:Eu^{2+},Ce^{3+}$ $ZnS:Ag^+,Cl^-$ $ZnS:Ag^+,Al^{3+}$ $SrY_2S_4:Eu^{2+}$ $CaLa_2S_4:Ce^{3+}$ $(Ba,Sr,Ca)MgP_2O_7:Eu^{2+},Mn^{2+}$ $(Y,Lu)_2WO_6:Eu^{3+},Mo^{6+}$ $(Ba,Sr,Ca)_\beta Si_\gamma N_\mu:Eu^{2+}$ (wherein $2\beta+4\gamma=3\mu$)

$Ca_3(SiO_4)Cl_2:Eu^{2+}$ $(Y,Lu,Gd)_{2-\phi}Ca_\phi Si_4N_{6+\phi}C_{1-\phi}:Ce^{3+}$, (wherein $0 \leq \phi \leq 0.5$)

$(Lu,Ca,Li,Mg,Y)$alpha-SiAlON doped with $Eu^{2+}$ and/or $Ce^{3+}$ $(Ca,Sr,Ba)SiO_2N_2:Eu^{2+},Ce^{3+}$ $3.5MgO*0.5MgF_2*GeO_2:Mn^{4+}$ $Ca_{1-c-f}Ce_cEu_fAl_{1+c}Si_{1-c}N_3$, (where $0 \leq c \leq 0.2$, $0 \leq f \leq 0.2$)

$Ca_{1-h-r}Ce_hEu_rAl_{1-h}(Mg,Zn)_hSiN_3$, (where $0 \leq h \leq 0.2$, $0 \leq r \leq 0.2$)

$Ca_{1-2s-t}Ce_s(Li,Na)_sEu_tAlSiN_3$, (where $0 \leq s \leq 0.2$, $0 \leq f \leq 0.2$, $s+t>0$)

$Ca_{1-\sigma-\chi-\phi}Ce_\sigma(Li,Na)_\chi Eu_\phi Al_{1+\sigma-\chi}Si_{1-\sigma+\chi}N_3$, (where $0 \leq \sigma \leq 0.2$, $0 \leq \chi \leq 0.4$, $0 \leq \phi \leq 0.2$)

For purposes of the present application, it should be understood that when a phosphor has two or more dopant ions (i.e. those) ions following the colon in the above compositions and separated with a comma, this is to mean that the phosphor has at least one (but not necessarily all) of those dopant ions within the material. That is, as understood by those skilled in the art, this type of notation means that the phosphor can include any or all of those specified ions as dopants in the formulation.

When the phosphor composition includes a blend of two or more phosphors, the ratio of each of the individual phosphors in the phosphor blend may vary depending on the characteristics of the desired light output. The relative proportions of the individual phosphors in the various embodiment phosphor blends may be adjusted such that when their emissions are blended and employed in an lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. Preferably, the color point of the white light will lie on or substantially on the Planckian (also known as the blackbody) locus, e.g. within 0.020 units in the vertical (y) direction of the CIE 1931 chromaticity diagram, more preferably within 0.010 units in the vertical direction. As stated, however, the identity and amounts of each phosphor in the phosphor composition can be varied according to the needs of the end user. Since the efficiency of individual phosphors may vary widely between suppliers, the exact amounts of each phosphor needed are best determined empirically, e.g. through standard design of experiment (DOE) techniques.

It may be desirable to add pigments or filters to the phosphor composition. When the LED is a UV emitting LED, the phosphor layer may also comprise from 0 up to about 10% by weight (based on the total weight of the phosphors) of a pigment or other UV absorbent material capable of absorbing or reflecting UV radiation having a wavelength between 200 nm and 500 nm.

Suitable pigments or filters include any of those known in the art that are capable of absorbing radiation generated between 200 nm and 500 nm. Such pigments include, for example, nickel titanate or praseodymium zirconate. The pigment may be used in an amount effective to filter 10% to 100% of the radiation generated in the 200 nm to 500 nm range.

EXAMPLES

Example 1

Figure 5:
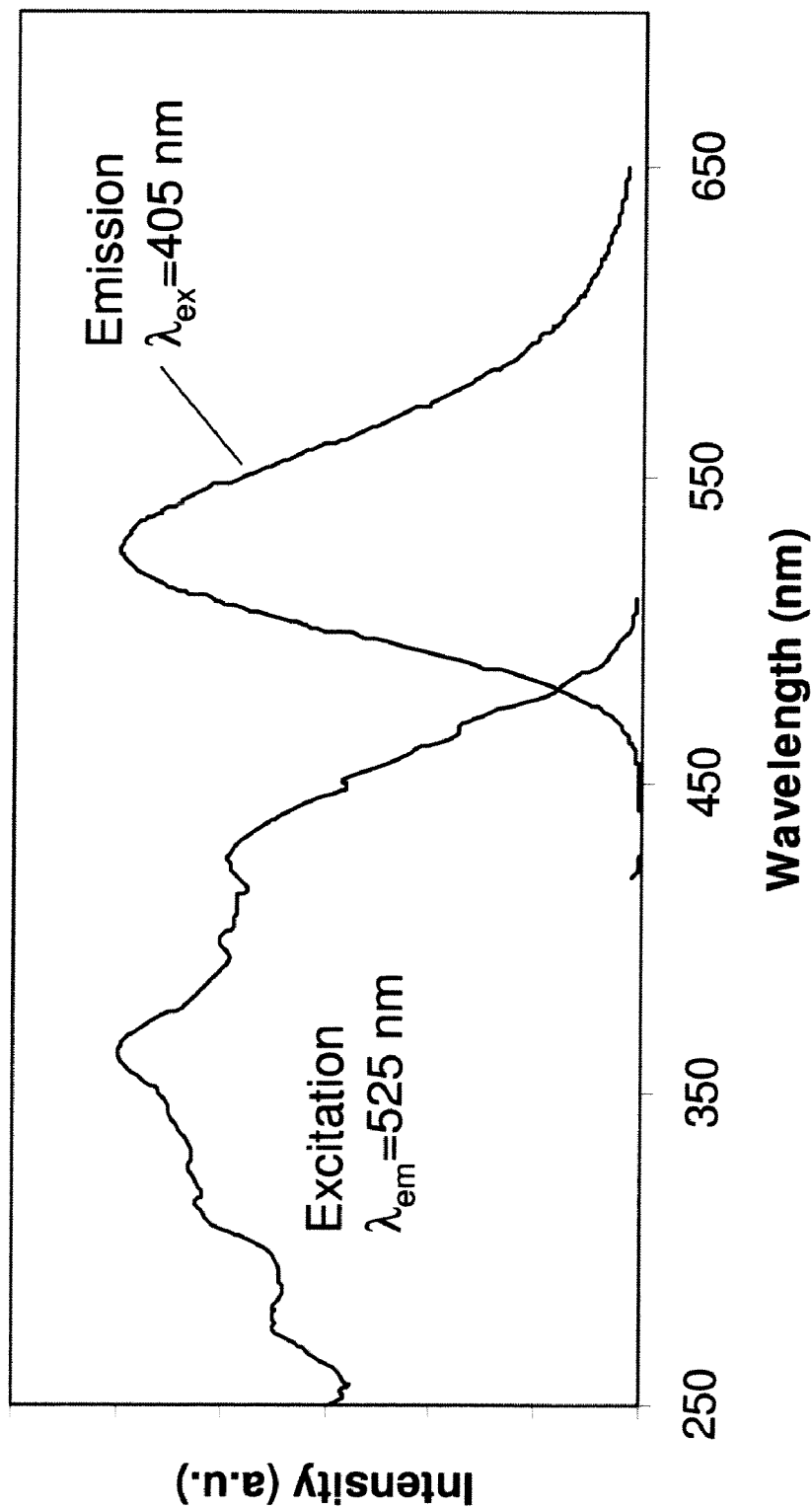
FIG. 5 is a graph of the excitation and emission spectra of a phosphor material according to one embodiment of the present invention.
Figure 6:
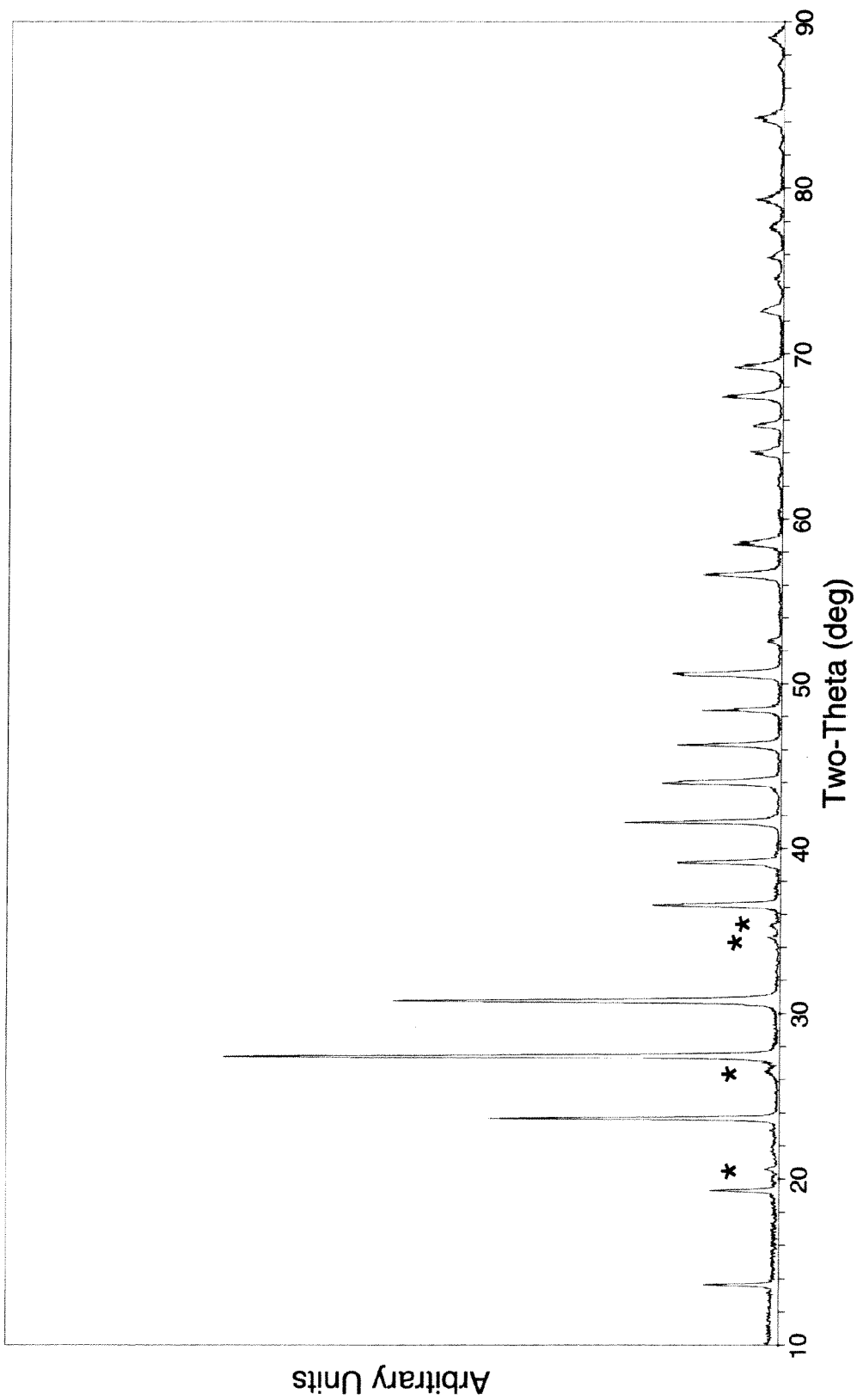
FIG. 6 is an X-ray diffraction pattern for the same phosphor material.
Figure 7:
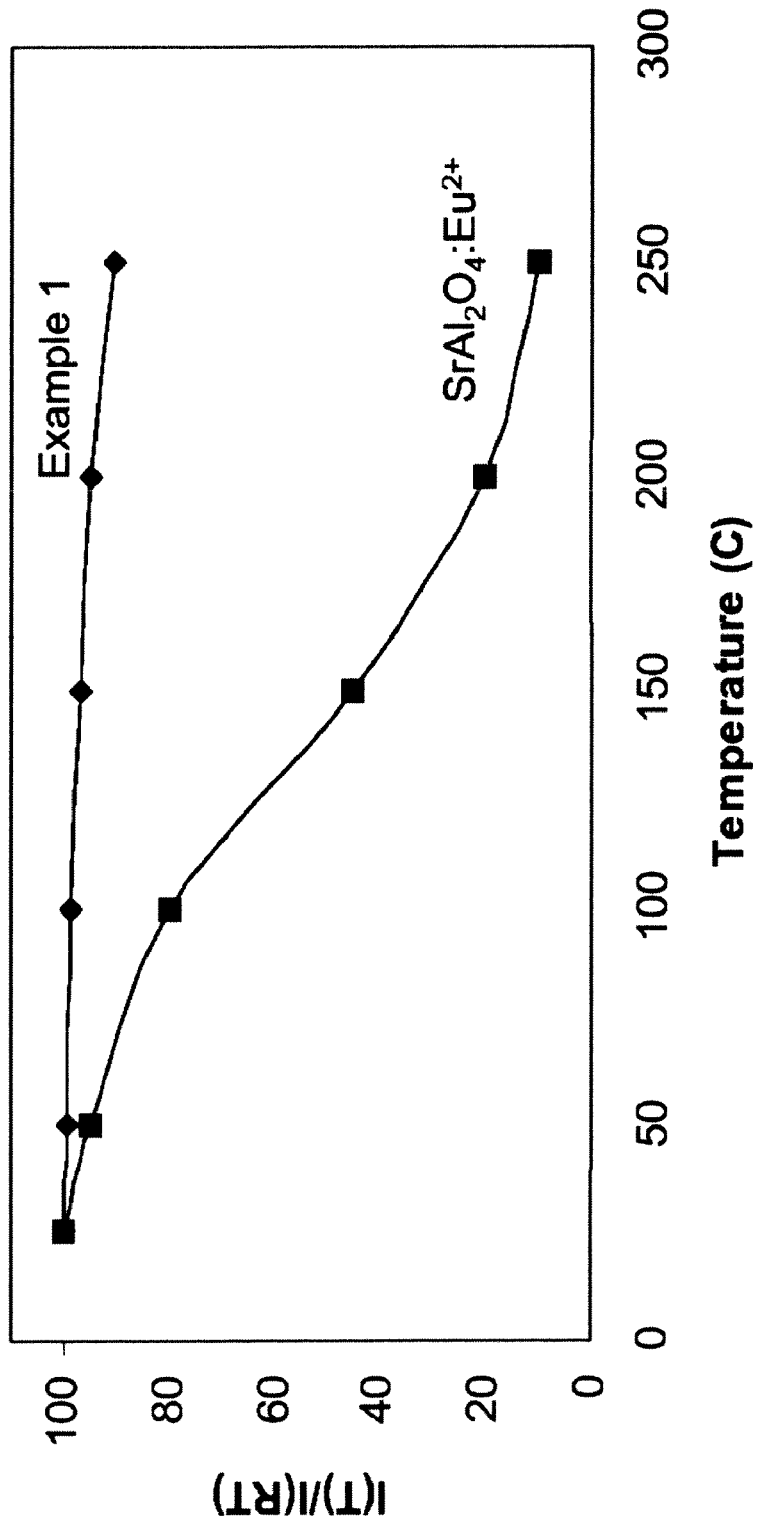
FIG. 7 is the thermal quenching of this phosphor material as a function of temperature versus a conventional phosphor.

The raw materials of 13.49 g $BaCO_3$, 8.90 g ZnO, 2.64 g silicic acid, 8.86 g $Si_3N_4$, and 0.48 g $Eu_2O_3$ were dry mixed for 2 hrs with zirconia media. The sample was fired in a Mo crucible at 1300° C. in a 0.75% $H_2$/balance $N_2$ atmosphere for six hours. The sample was then ground using a mortar and pestle and washed in hot water for 1 hour. After this, x-ray fluorescence measurements found that the Zn concentration in this powder was <2 wt %. The excitation and emission spectra for this phosphor are given in FIG. 5. The X-ray diffraction pattern (taken using Cu Kα1 radiation, λ=1.54059 Å) for this phosphor is given in FIG. 6, and shows the desired phase along with residual $Si_3N_4$ within this material. The $Si_3N_4$ peaks are marked with asterisks. The luminescent intensity as a function of temperature for this phosphor versus a conventional green oxide phosphor ($SrAl_2O_4$:Eu) is shown in FIG. 7. It can be seen that the present phosphor exhibits much less thermal quenching than the prior art phosphor.

Examples 2-6

Various phosphor formulations were produced. The raw materials used to make these phosphors were $BaCO_3$, $SiO_2$, $Si_3N_4$, $Eu_2O_3$. The samples were formulated such that the molar ratio of Si/(Ba+Eu)=3 and $SiO_2/Si_3N_4$=3. The exact formulation and appropriate amounts of raw materials for examples 2-6 are given below.

Example 2

$Ba_{0.95}Eu_{0.05}Si_3N_2O_4$ phosphor. The following amounts: 2.628 g of $BaCO_3$, 0.124 g of $Eu_2O_3$, 1.558 g of $SiO_2$ and 0.985 g of $Si_3N_4$ were weighted out and processed further as given in the procedure below.

Example 3

$Ba_{0.99}Eu_{0.01}Si_3N_2O_4$ phosphor. The following amounts: 2.935 g of $BaCO_3$, 0.0248 g of $Eu_2O_3$, 1.558 g of $SiO_2$ and 0.985 g of $Si_3N_4$ were weighted out and processed further as given in the procedure below.

Example 4

$Ba_{0.97}Eu_{0.03}Si_3N_2O_4$ phosphor. The following amounts: 2.684 g of $BaCO_3$, 0.0746 g of $Eu_2O_3$, 1.558 g of $SiO_2$ and 0.985 g of $Si_3N_4$ were weighted out and processed further as given in the above procedure.

Example 5

$Ba_{0.925}Eu_{0.075}Si_3N_2O_4$ phosphor. The following amounts: 2.559 g of $BaCO_3$, 0.1864 g of $Eu_2O_3$, 1.558 g of $SiO_2$ and 0.985 g of $Si_3N_4$ were weighted out and processed further as given in the above procedure Example 6

$Ba_{0.9}Eu_{0.1}Si_3N_2O_4$ phosphor. The following amounts: 2.490 g of $BaCO_3$, 0.2486 g of $Eu_2O_3$, 1.558 g of $SiO_2$ and 0.985 g of $Si_3N_4$ were weighted out and processed further as given in the above procedure These powders were dry mixed for 3 hrs with zirconia media. The sample is fired in a alumina crucible at 1300° C. in a 1% $H_2$ in 99% $N_2$ atmosphere for 10 hours. Upon completion of firing, the cake was milled to a $d_{50}$ value of 10 microns as determined by light scattering methods (Horiba LA-910). The emission wavelength versus Eu concentration is given is shown in the Example phosphor maximum emission table below (Table 3 following the examples).

The phosphor $Ba_{0.95}Eu_{0.05}Si_3N_2O_4$ (Example 2) exhibits minimal thermal quenching at higher temperatures, as shown in Table 2 below.

TABLE 2

| Temp (° C.) | Normalized Intensity(%) |
|---|---|
| 25 | 100 |
| 50 | 99 |
| 75 | 98 |
| 100 | 97 |
| 125 | 96 |
| 150 | 94 |
| 175 | 93 |
| 200 | 92 |

Figure 9:
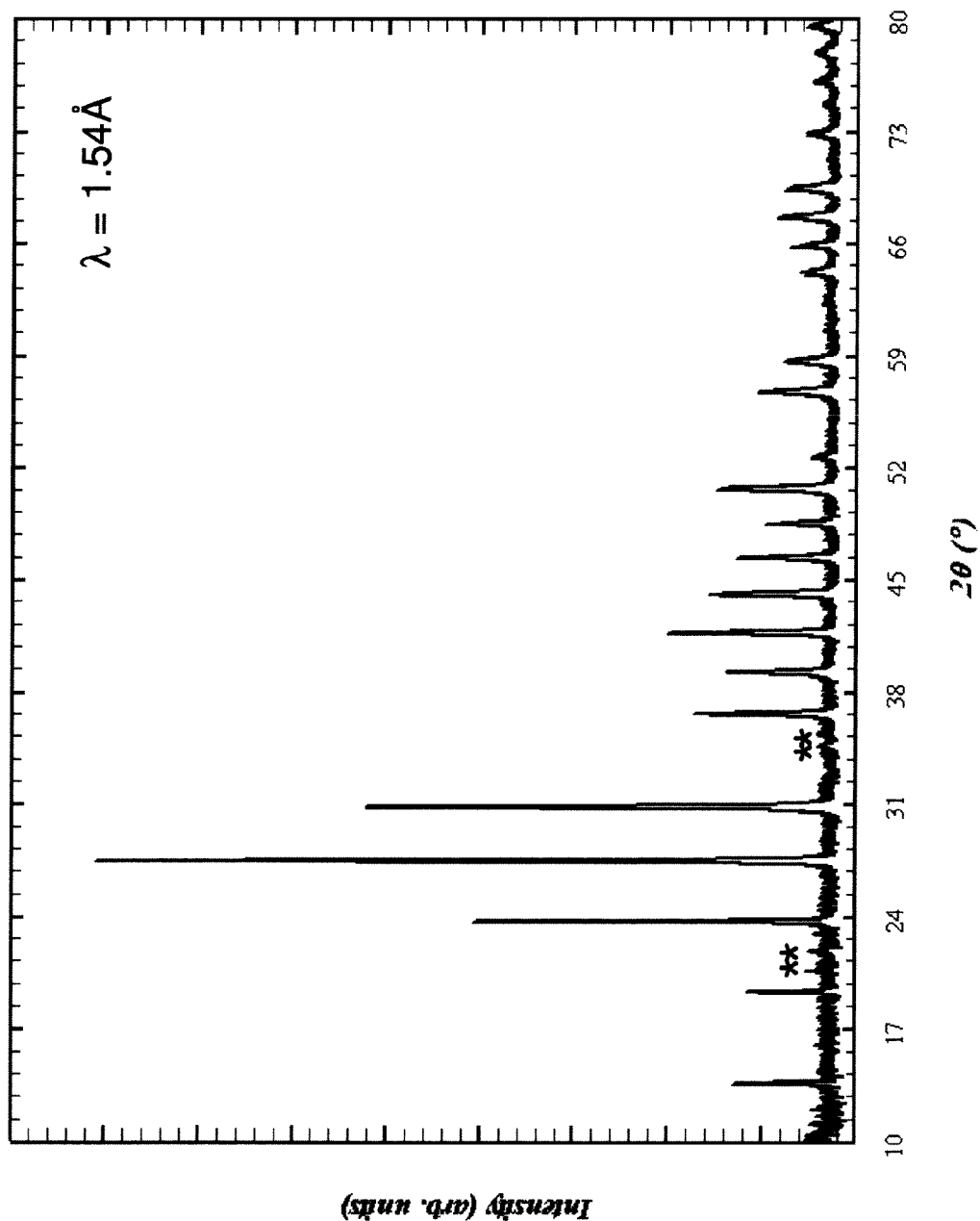
FIG. 9 is an X-ray diffraction pattern of a phosphor material according to another embodiment of the present invention.
Figure 10:
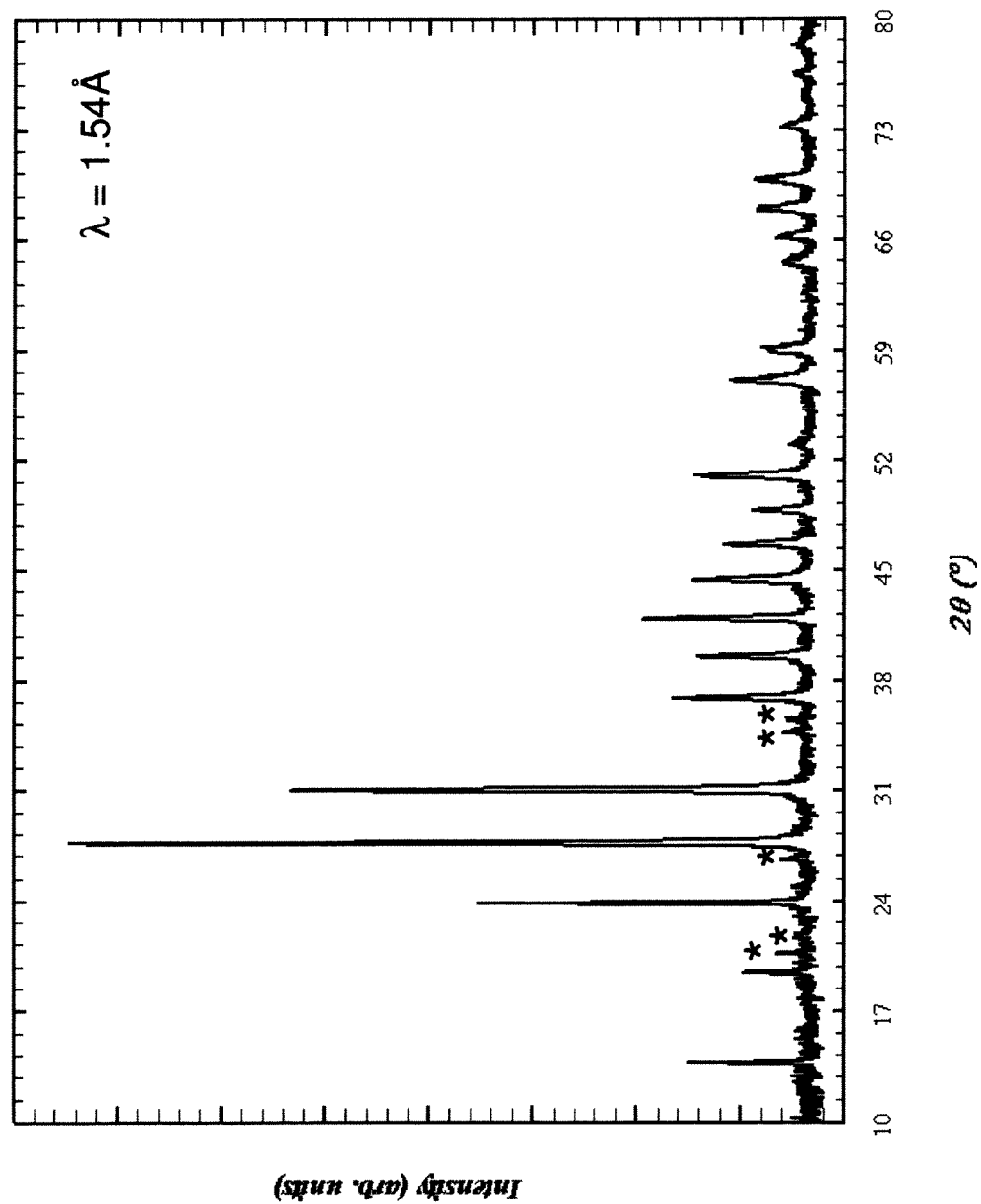
FIG. 10 is an X-ray diffraction pattern of a phosphor material according to yet another embodiment of the present invention.
Figure 11:
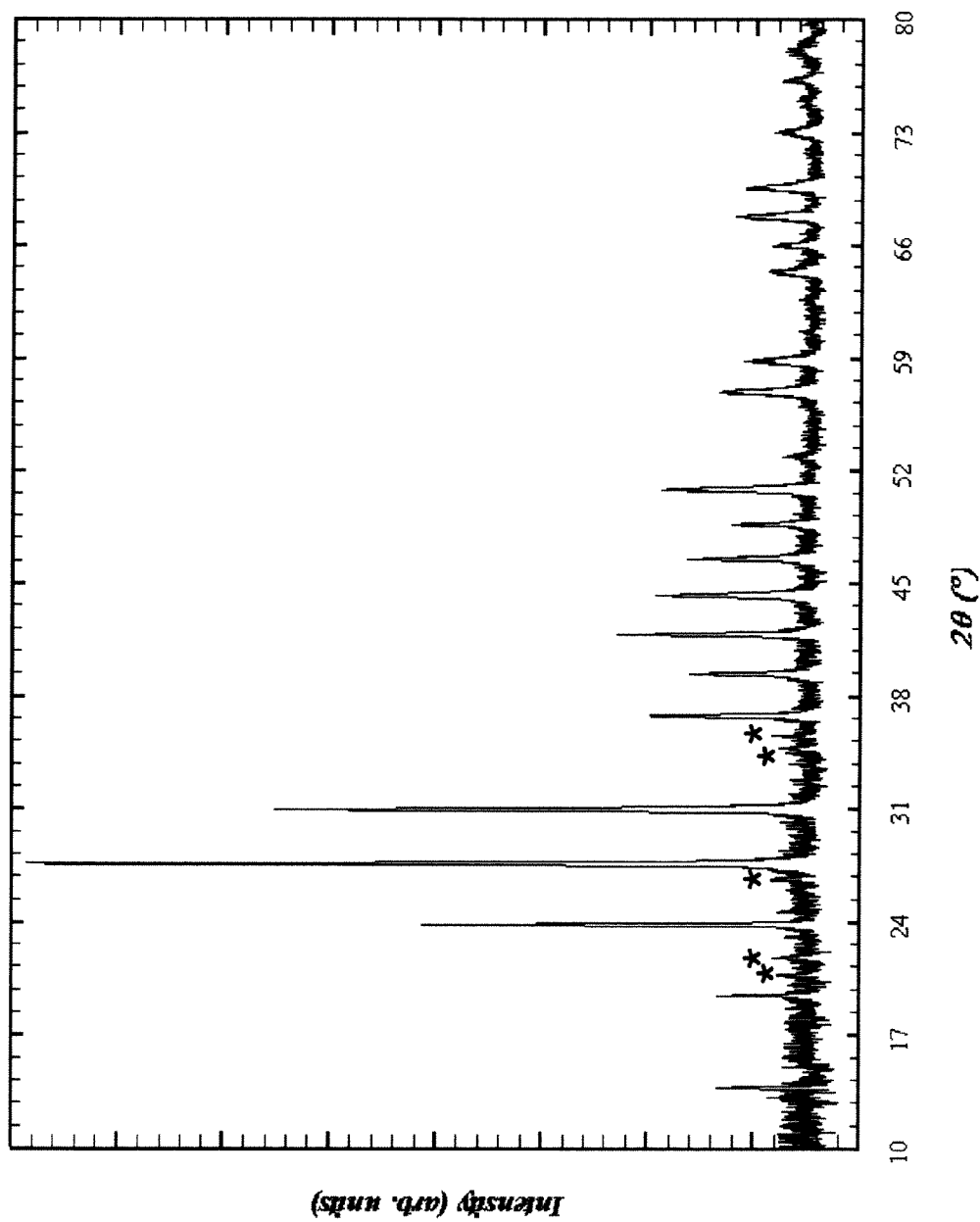
FIG. 11 is an X-ray diffraction pattern of a phosphor material according to still yet another embodiment of the present invention.

The X-ray diffraction pattern for Example 2 is given in FIG. 9, and shows the desired phase along with small traces of residual $Si_3N_4$ within this material. The $Si_3N_4$ peaks are marked with asterisks.

Examples 7-12

Various phosphor formulations were produced to make 10 g batches. The raw materials used to make these sample phosphors were $BaCO_3$, $SrCO_3$ $SiO_2$ (via silicic acid), $Si_3N_4$, $Eu_2O_3$ and were dry mixed for 3 hrs with zirconia media. The samples were formulated such that the molar ratio of Si/(Ba+Eu+Sr)=3 and $SiO_2/Si_3N_4$=3. The samples were fired in an alumina crucible at 1300° C. in a 1% $H_2$ in 99% $N_2$ atmosphere for 10 hours. Upon completion of firing, the cake was milled to a $d_{50}$ value of 10 microns as determined by the light scattering method (Horiba LA-910). The wavelength shift with Sr addition to this phosphor can be seen in the Example phosphor maximum emission table 3. The X-ray diffraction pattern for the Example 10 phosphor is given in FIG. 10, and shows the desired phase along with residual $Si_3N_4$ within this material. The $Si_3N_4$ peaks are marked with asterisks.

Examples 13-19

Various phosphor formulations were produced to make 10 g batches. The raw materials used to make the compositions detailed in the table below were $BaCO_3$, $La_2O_3$, $Y_2O_3$, $Li_2CO_3$, $Na_2CO_3$, $K_2CO_3$, $SiO_2$ (via silicic acid), $Si_3N_4$, and $Eu_2O_3$. These components were formulated such that the molar ratio of $SiO_2/Si_3N_4$ was 3:1 and were dry mixed for 3 hrs with zirconia media. The samples are fired in a alumina crucible at 1300° C. in a 1% $H_2$ in 99% $N_2$ atmosphere for 10 hours. Upon completion of firing, the green cake was milled to a $d_{50}$ value of 10 microns as determined by light scattering methods (Horiba LA-910). The emission maximum versus composition is given in table 3. The X-ray diffraction pattern for Example 16 is given in FIG. 11 and shows the desired phase with traces of residual $Si_3N_4$ within this material. The $Si_3N_4$ peaks are marked with asterisks.

TABLE 3

Example Phosphor Maximum Emissions (Examples 2-19)

| Example | Composition | $\lambda_{max}$ (nm) |
|---|---|---|
| 2 | $Ba_{0.95}Eu_{0.05}Si_3N_2O_4$ | 528 |
| 3 | $Ba_{0.99}Eu_{0.01}Si_3N_2O_4$ | 520 |
| 4 | $Ba_{0.97}Eu_{0.03}Si_3N_2O_4$ | 524 |
| 5 | $Ba_{0.925}Eu_{0.075}Si_3N_2O_4$ | 531 |
| 6 | $Ba_{0.9}Eu_{0.1}Si_3N_2O_4$ | 531 |
| 7 | $Ba_{0.95}Sr_{0.0}Eu_{0.05}Si_3N_2O_4$ | 527 |
| 8 | $Ba_{0.85}Sr_{0.1}Eu_{0.05}Si_3N_2O_4$ | 538 |
| 9 | $Ba_{0.75}Sr_{0.2}Eu_{0.05}Si_3N_2O_4$ | 543 |
| 10 | $Ba_{0.70}Sr_{0.25}Eu_{0.05}Si_3N_2O_4$ | 549 |
| 11 | $Ba_{0.65}Sr_{0.3}Eu_{0.05}Si_3N_2O_4$ | 549 |
| 12 | $Ba_{0.60}Sr_{0.35}Eu_{0.05}Si_3N_2O_4$ | 549 |
| 13 | $Ba_{0.85}La_{0.05}Li_{0.05}Eu_{0.05}Si_3N_2O_4$ | 528 |
| 14 | $Ba_{0.75}La_{0.1}Li_{0.1}Eu_{0.05}Si_3N_2O_4$ | 531 |
| 15 | $Ba_{0.85}La_{0.05}K_{0.05}Eu_{0.05}Si_3N_2O_4$ | 527 |
| 16 | $Ba_{0.75}La_{0.1}K_{0.1}Eu_{0.05}Si_3N_2O_4$ | 531 |
| 17 | $Ba_{0.85}La_{0.05}K_{0.05}Eu_{0.05}Si_3N_2O_4$ | 527 |
| 18 | $Ba_{0.75}La_{0.1}K_{0.1}Eu_{0.05}Si_3N_2O_4$ | 527 |
| 19 | $Ba_{0.9}Y_{0.067}Eu_{0.05}Si_3N_2O_4$ | 527 |

Figure 12:
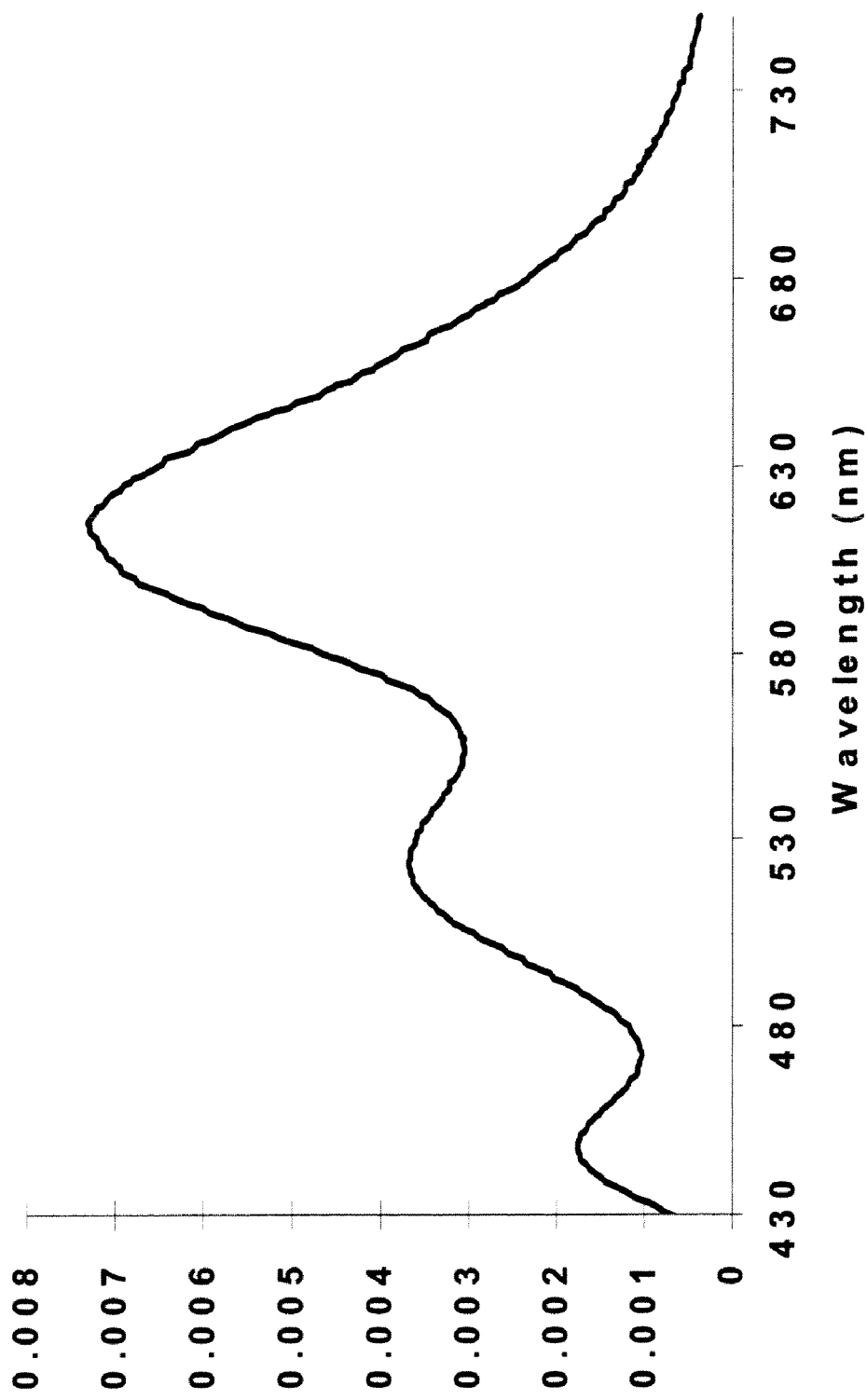
FIG. 12 is a simulated emission spectrum for a phosphor blend according to one embodiment.

Light sources using phosphor blends according to the above embodiments may be produced. Two different exemplary prophetic trials are presented. In a first trial, a triphosphor blend of $(Ca,Sr,Ba)_5(PO_4)_3Cl:Eu^{2+}$, ("SECA"), $(Sr_{0.97}Ce_{0.01}Eu_{0.01}Na_{0.01})_2Si_5N_8$ ("SCESN") and the new phosphor from Example 1 was used. By varying the relative amounts of each phosphor in the blend, various blends having any desired CCT value between 2500 K and 10,000 K can be made. The luminous efficacy and CRI ($R_a$) of various CCT blends are shown in table 4 below. FIG. 12 shows the simulated emission spectrum of a blend according to the above embodiment having a color temperature of 2700 K. Thus, it can be seen how the present invention allows one to easily tune the CCT of a white light device by altering the amounts of the individual phosphors in a phosphor blend, all the while maintaining very high $R_a$ values (90 or greater).

TABLE 4

| CCT, K | lm/Wopt | Ra |
|---|---|---|
| 2500 | 303 | 91 |
| 2800 | 305 | 92 |
| 3000 | 306 | 93 |
| 3500 | 304 | 94 |
| 4000 | 301 | 95 |
| 4500 | 297 | 95 |
| 5000 | 292 | 95 |
| 5500 | 288 | 95 |
| 6500 | 280 | 94 |
| 7500 | 273 | 94 |
| 10000 | 261 | 94 |

Figure 13:
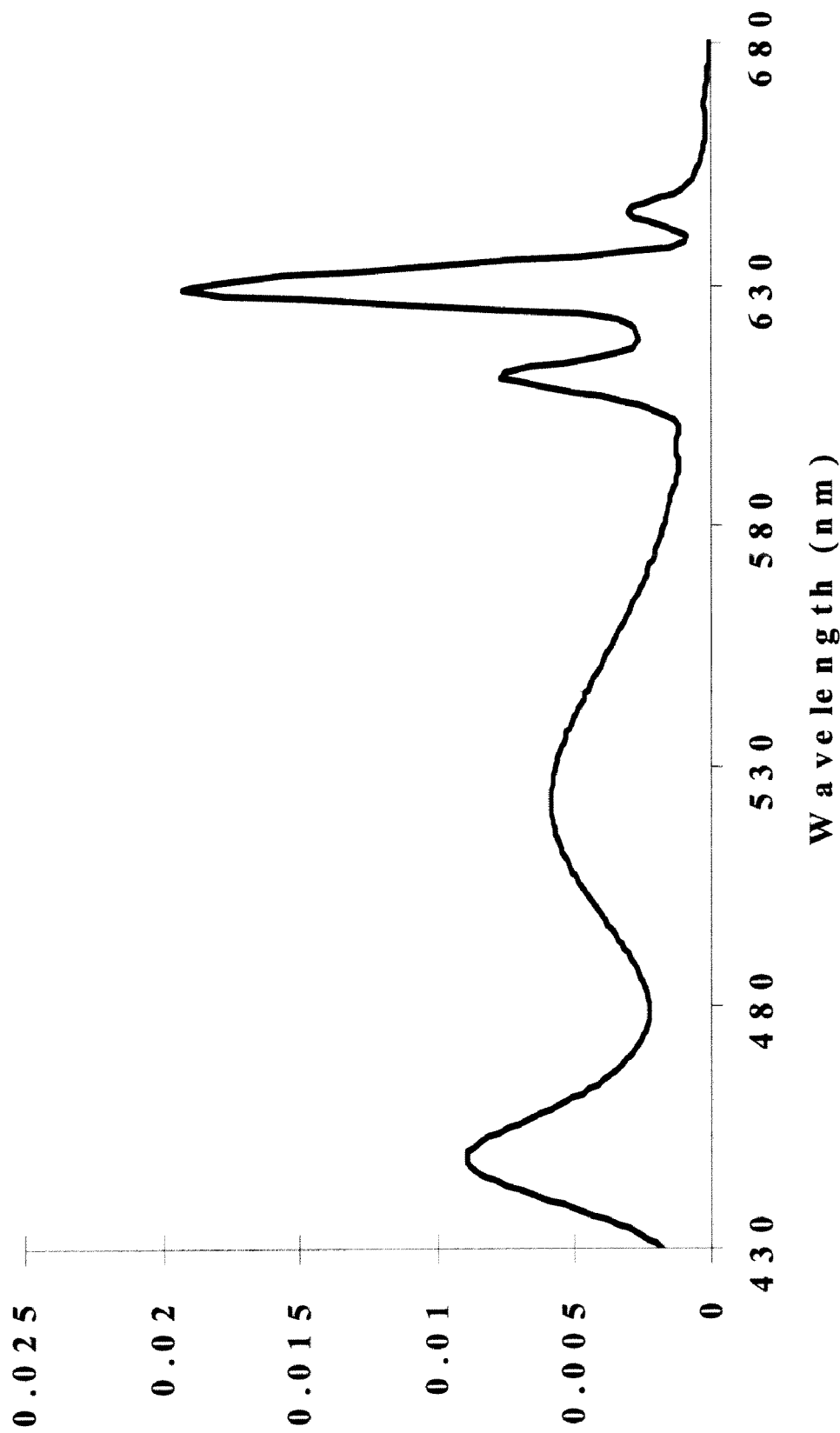
FIG. 13 is a simulated emission spectrum for a backlight device including a phosphor blend according to another specific embodiment.

Similarly, a second prophetic trial using a phosphor blend containing the red phosphor $K_2SiF_6:Mn^{4+}$ and the new phosphor from Example 1 along with a blue emitting LED having a peak wavelength of 450 nm was conducted. As with the first blend, altering the relative amount of each phosphor as well as controlling the amount of LED bleed through allows one to generate various CCT value lamps. FIG. 13 shows the calculated emission spectrum of a 6500 K backlight device according to this embodiment. The inclusion of deep red phosphors is such as those listed in commonly owned U.S. Patent Application Publication No. 2007/100824, filed on Feb. 26, 2007, and U.S. Patent Application Publication No. 2007/0205712, filed on Feb. 13, 2007, the disclosures of which are incorporated herein by reference, is desirable. One preferred example of such a phosphor is $K_2SiF_6:Mn^{4+}$.

Apart from white light blends for general illumination, these phosphors can be used either individually or in blends for LEDs for traffic signals, signage, and particularly for LCD backlighting applications. The green emission allows for a saturated color that is highly desirable for these applications.

The phosphor materials described above may be used in additional applications besides LEDs. For example, the material may be used as a phosphor in a fluorescent lamp, in a cathode ray tube, in a plasma display device or in a liquid crystal display (LCD). These uses are meant to be merely exemplary and not exhaustive.

The present development has been described with reference to various exemplary embodiments. Modifications and alteration will occur to others upon a reading and understanding of this specification. The invention is intended to include all such modifications and alterations insofar as they come within the scope of the appended claims or the equivalent thereof.

What is claimed is:

1. A luminescent material within a $BaO$—$SiO_2$—$Si_2N_3$ system activated by at least one of $Eu^{2+}$ and $Ce^{3+}$, said material having an x-ray diffraction pattern exhibiting peaks having a d-spacing substantially matching the following list:

| d(Angstroms) |
|---|
| 6.46 |
| 4.58 |
| 3.75 |

-continued

| d(Angstroms) |
| --- |
| 3.24 |
| 2.89 |
| 2.45 |
| 2.29 |
| 2.16 |
| 2.05 |
| 1.95 |
| 1.87 |
| 1.80. |

2. A luminescent material according to claim 1, wherein said material has an x-ray diffraction pattern exhibiting peaks with relative intensities and d-spacing substantially matching the following peak list:

| d (Angstroms) | Intensity |
| --- | --- |
| 6.46 | 14 |
| 4.58 | 12 |
| 3.75 | 48 |
| 3.24 | 100 |
| 2.89 | 63 |
| 2.45 | 19 |
| 2.29 | 14 |
| 2.16 | 22 |
| 2.05 | 16 |
| 1.95 | 14 |
| 1.87 | 9 |
| 1.80 | 16. |

3. The luminescent material of claim 1, wherein said material comprises at least $(Ba,Sr,Ca,Mg,Zn,Mn)_a Eu_b (Li,Na,K)_c (RE,Y,Sc)_d Si_e O_f N_g$ where $0.5 \leq a < 1$, $b > 0$, $2.5 < e \leq 3.5$, $3 \leq f \leq 5$, $1.5 \leq g \leq 2.5$, $a+b+c+d=1$, and $2a+2b+c+3d+4e=2f+3g$.

4. The luminescent material of claim 3, wherein the molar ratio of $Ba/(Ba+Sr+Ca+Mg+Zn+Mn+Eu) \geq 0.5$.

5. The luminescent material of claim 3, wherein $2.8 \leq e \leq 3.2$; $3.5 \leq f \leq 4.5$; $1.75 \leq g \leq 2.25$.

6. The luminescent material of claim 3, wherein $b \leq 0.1$.

7. The luminescent material of claim 3, wherein $c \leq 0.2$.

8. The luminescent material of claim 1, wherein said material comprises $(Ba,Sr,Ca,Mg,Zn,Mn)_a Eu_b Al_c Si_d O_e N_f$ where $0.5 \leq a < 1$, $b > 0$, $2.5 < d \leq 3.5$, $3 \leq e \leq 5$, $1.5 \leq f \leq 2.5$, $a+b=1$, and $2a+2b+3c+4d=2e+3f$.

9. The luminescent material of claim 8, wherein the molar ratio of $Ba/(Ba+Sr+Ca+Mg+Zn+Mn+Eu) \geq 0.6$.

10. The luminescent material of claim 8, wherein $b \leq 0.1$.

11. The luminescent material of claim 8, wherein $c \leq 0.9$.

12. The luminescent material of claim 1, wherein the material comprises $(Ba,Sr,Ca,Mg,Zn,Mn)_a Eu_b (RE,Y,Sc)_c Al_d Si_e O_f N_g$ where $0.5 \leq a < 1$, $b > 0$, $2.5 < d+e \leq 3.5$, $3 \leq f \leq 5$, $1.5 \leq g \leq 2.5$, $a+b+c=1$, and $2a+2b+3c+3d+4e=2f+3g$.

13. The luminescent material of claim 12, wherein the molar ratio of $Ba/(Ba+Sr+Ca+Mg+Zn+Mn+Eu) \geq 0.6$.

14. The luminescent material of claim 12, wherein $2.8 \leq d+e \leq 3.2$; $3.5 \leq f \leq 4.5$; $1.75 \leq g \leq 2.25$.

15. The luminescent material of claim 12, wherein $b \leq 0.1$.

16. The luminescent material of claim 12, wherein $c \leq 0.2$.

17. The luminescent material of claim 1, wherein said material comprises $(Ba,Sr,Ca,Mg,Zn,Mn)_a Eu_b (Li,Na,K)_c P_d Si_e O_f N_g$ where $0.5 \leq a < 1$, $b > 0$, $2.5 < d+e \leq 3.5$, $3 \leq f \leq 5$, $1.5 \leq g \leq 2.5$, $a+b+c=1$, and $2a+2b+c+5d+4e=2f+3g$.

18. The luminescent material of claim 17, wherein the molar ratio of $Ba/(Ba+Sr+Ca+Mg+Zn+Mn+Eu) \geq 0.6$.

19. The luminescent material of claim 17, wherein $2.8 \leq d+e \leq 3.2$; $3.5 \leq f \leq 4.5$; $1.75 \leq g \leq 2.25$.

20. The luminescent material of claim 17, wherein $b \leq 0.1$.

21. The luminescent material of claim 17, wherein $c \leq 0.2$.

22. A luminescent material comprising at least $(Ba,Sr,Ca,Mg,Zn,Mn)_a Eu_b Si_c O_d N_e$ where $0.5 \leq a < 1$, $2.5 < c \leq 3.5$, $3 \leq d \leq 5$, $1.5 \leq e \leq 2.5$, $a+b=1$, and $2+4c=2d+3e$.

23. The luminescent material of claim 22, where the molar ratio of $Ba/(Ba+Sr+Ca+Mg+Zn+Eu+Mn) \geq 0.5$.

24. The luminescent material of claim 22, wherein $2.8 \leq c \leq 3.2$; $3.5 \leq d \leq 4.5$; and $1.75 \leq e \leq 2.25$.

25. The luminescent material of claim 22, wherein $b \leq 0.1$.

26. A phosphor blend comprising a first phosphor composition comprising the luminescent material of claim 1, and at least one additional phosphor.

27. The phosphor blend of claim 26, wherein said at least one additional phosphor comprises at least one of an alkaline earth nitridosilicate doped with Eu(II) and/or Ce(III), alkaline earth silicate doped with Eu(II), alkaline earth aluminate doped with Eu(II), garnet doped with Ce(III), complex fluoride doped with Mn(IV), oxyfluoride doped with Mn(IV), and alkaline earth haloapatite doped with Eu(II).

28. A light emitting device comprising a light source having a peak emission in the range of from about 200 to about 500 nm and a phosphor radiationally coupled to the light source comprising the luminescent material of claim 1.

29. The light emitting device of claim 28, wherein the light source is an LED.

30. The light emitting device of claim 29, wherein the LED comprises a nitride compound semiconductor represented by the formula $In_i Ga_j Al_k N$, where $0 \leq i$; $0 \leq j$, $0 \leq k$, and $i+j+k=1$.

31. The light emitting device of claim 28, wherein the phosphor material is coated on a surface of the light source.

32. The light emitting device of claim 28, further comprising an encapsulant surrounding the light source and the phosphor material.

33. The light emitting device of claim 28, wherein the phosphor material is dispersed in the encapsulant.

34. The light emitting device of claim 28, further comprising a reflector cup.

35. The light emitting device of claim 28, wherein said device emits white light.

36. The light emitting device of claim 35, wherein said device has a general CRI ($R_a$) of 90 or greater.

37. A backlight device comprising the luminescent material of claim 1 and a blue to near-UV emitting LED chip having a peak emission wavelength from about 300 nm to about 500 nm.

* * * * *